United States Patent [19]

Phillips

[11] 4,029,170

[45] June 14, 1977

[54] RADIAL SOUND PORT SPEAKER

[75] Inventor: Jesse O. Phillips, Albuquerque, N. Mex.

[73] Assignee: B & P Enterprises, Inc., Oklahoma City, Okla.

[22] Filed: Sept. 6, 1974

[21] Appl. No.: 503,953

[52] U.S. Cl. ................................ 181/155; 181/148; 181/160

[51] Int. Cl.[2] ..................... H05K 5/00; G10K 13/00

[58] Field of Search .................... 181/155, 160, 148

[56] References Cited

UNITED STATES PATENTS

| | | | |
|---|---|---|---|
| 2,891,629 | 6/1959 | Mercurius | 181/145 |
| 2,917,127 | 12/1959 | Elliott | 181/151 |
| 3,143,182 | 8/1964 | Sears et al. | 181/153 |
| 3,239,028 | 3/1966 | Murray | 181/154 |
| 3,938,617 | 2/1976 | Forbes | 181/148 |

*Primary Examiner*—Stephen J. Tomsky
*Attorney, Agent, or Firm*—Laney, Dougherty, Hessin & Fish

[57] ABSTRACT

A speaker component mounted into a frame and related structure which is designed to reproduce sound in its most real and true form from an amplifier or other sound source and including a speaker mounting panel for the speaker component, a back wall, a front sound diffusion panel, surrounding a frame with a base resonance chamber and a tenor resonance chamber and including dowels to separate the partition components forming the chambers and further including a sound diffusion receptacle area with sound ports communicating the receptacle area with the atmosphere and where the resonance chambers are airtight with all the components combining to reproduce sound without interference especially in a quadraphonic system.

6 Claims, 4 Drawing Figures

RADIAL SOUND PORT SPEAKER

BACKGROUND OF THE INVENTION

The present invention relates to a radial sound port speaker which structure is intended to reproduce sound in a high quality fashion and in its most true and pure sense from some sound source such as an amplifier and which is designed to function in cooperation with other similar speaker structures to produce a stereo or related effect.

In the past there have been many difficulties and problems in the speaker related art. This has been particularly true in the field of stereo. One problem encountered has been the quality of reproduction which has been insufficient in relation to the quality, pureness and reality of the sound reproduced. In addition, in stereo systems, it has been necessary in the past, in order to produce a stereo effect, to precisely locate the speaker systems and the listener in such a way as to avoid all interference between the sound waves emanating from the individual speakers. Another difficulty in the past has been the situation where, in order to produce high quality reproduction of sound in tone, pureness and clarity, it has been necessary to embody the speaker component in a large and bulky cabinet or other container often involving the use of large speaker components themselves.

Attempts to remedy the deficiencies and drawbacks of the past have included various speaker component containers, cabinets and the like with varying structures, components and materials.

However, such attempts have not succeeded in overcoming the difficulties and deficiencies of prior speaker components and their containers, cabinets or the like. The result has been that very little advancement has been made and the problems relating to distortion, interference and the cumbersome character of the containers has continued.

The primary object of the present invention is to provide a speaker including the speaker component and attendant structural surroundings which overcomes the problems and deficiencies and difficulties associated with past speakers in order to produce an environment in which the reproduction of sound from a given sound source even with an inferior speaker component, is of the highest quality, purity and clarity while reducing the size of the speaker itself.

Another object of the present invention is to provide a speaker including a speaker component and related structure which includes dual resonance chambers, as well as a sound diffusion receptacle area with ports connecting the receptacle area to the atmosphere and arranging the resonance chambers and their partitions as well as the speaker component itself and so structuring these related components such as to produce an environment of sound reproduction from any source, such as an amplifier, with extremely high quality, tone and clarity as well as advancing the longevity of the sound waves themselves.

Another object of the present invention is to provide a speaker, including a speaker component and related structure, which is simple and inexpensive of construction and operation and which is not prone to bulkiness and which may be easily concealed but which, nevertheless, produces an environment of sound reproduction of the highest quality, tone and clarity.

A still further object of the present invention is to provide a speaker which is adaptable to and capable of a variety of uses in combination with other speakers, especially in quadraphonic systems to reproduce sound in a stereo environment without interference or distortion and with the tedious location in precise terms of both the listener and the speakers themselves.

Yet another object of the present invention is to provide a speaker of the type indicated which is capable of the functions referred to and which is based upon fundamental sound principles and amplification and wherein a small speaker can sufficiently reproduce sound of the highest quality, tone and clarity, even with an inexpensive speaker component.

Other objects will appear hereinafter.

SUMMARY OF THE INVENTION

In accordance with the present invention, a speaker in the form of a combination of components including a speaker component mounted in a speaker component mounting panel as well as surrounding structure involving a frame or sound chamber frame encompassing the speaker component mcunted in the speaker component mounting panel and including as well a back wall or panel and a front wall or panel with a sound diffusion receptacle area formed between the front wall and speaker component mounted in its panel with ports connecting the receptacle area with the atmosphere and including a partition located between the back wall and the speaker component as mounted in its panel, and additionally including the formation of an area on each side of the partition such as to establish dual resonance chambers, one each in those areas on each side of the partition. Also included is a standard jack to connect the lead connector to the speaker and to any sound source with ribs located optionally on either or both of the speaker component mounting panel and the partition between the resonance chambers.

BRIEF DESCRIPTION OF THE DRAWINGS

For a more complete understanding of the present invention, reference will be made to the attached drawing figures forming a part of the present application. The drawings comprise 4 figures depicting various views of the speaker including the speaker component and its surrounding structure.

DETAILED DESCRIPTION OF THE DRAWINGS

Figure 1:
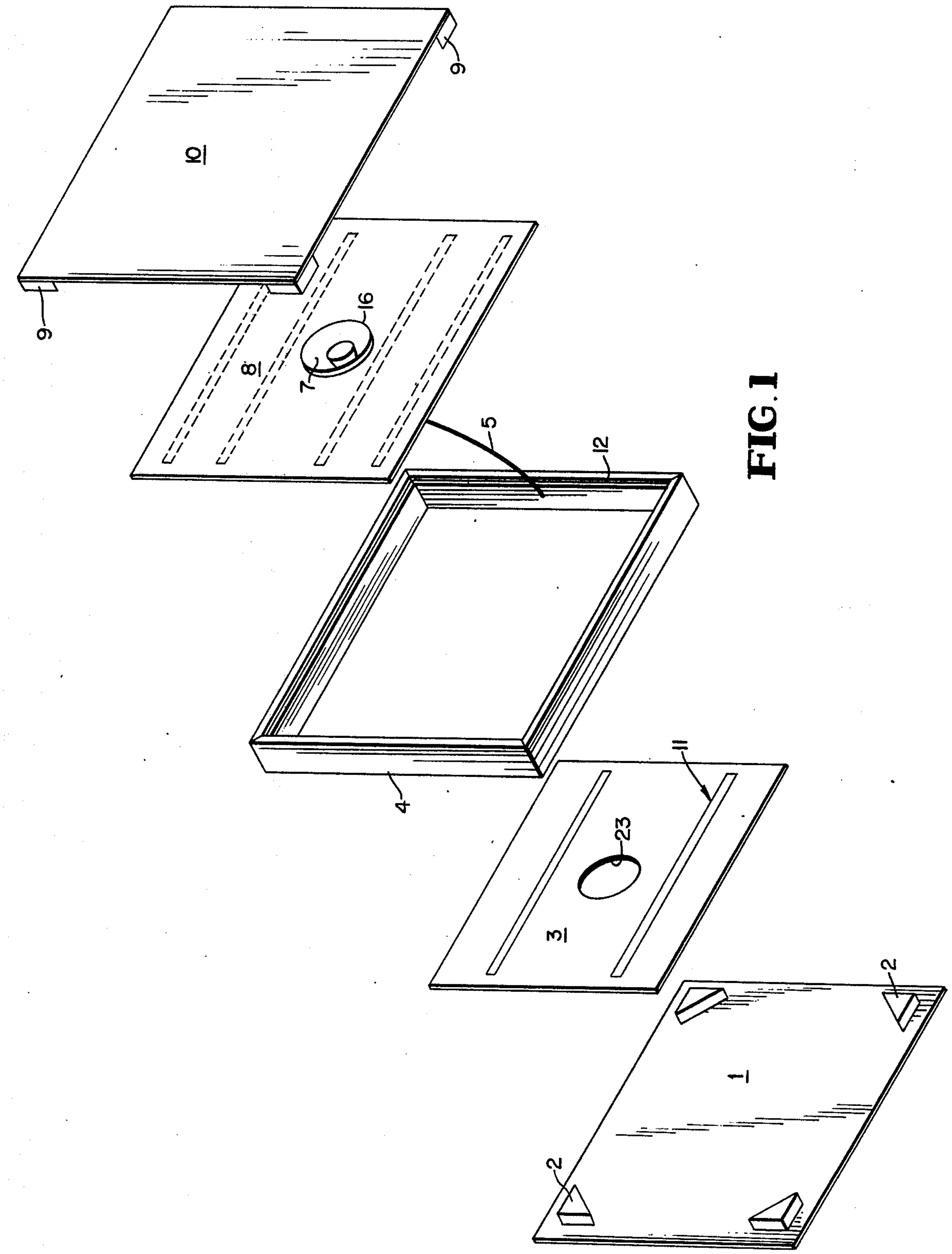
FIG. 1 is an exploded perspective view of the various features and components of the present invention.
Figure 3:
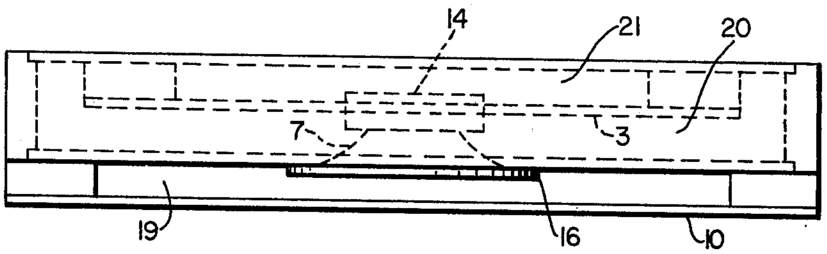
FIG. 3 is a top plan view of the speaker.
Figure 2:
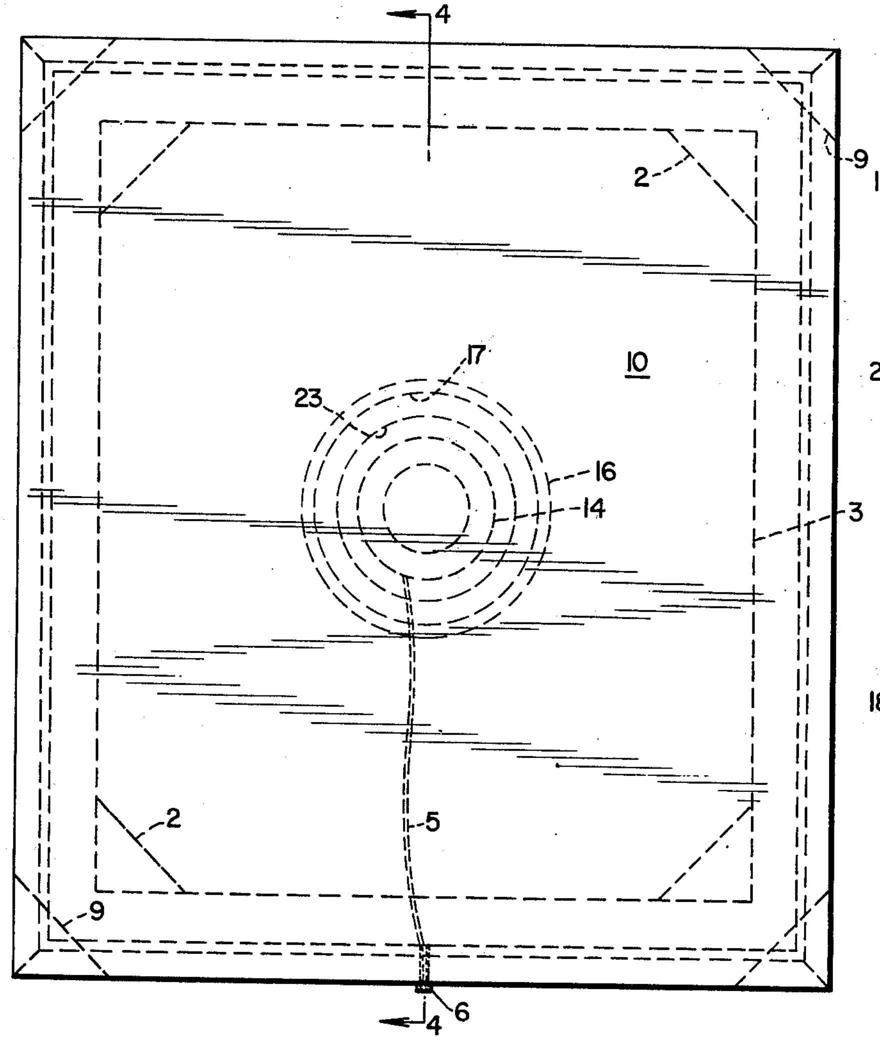
FIG. 2 is a front view of the speaker system.
Figure 4:
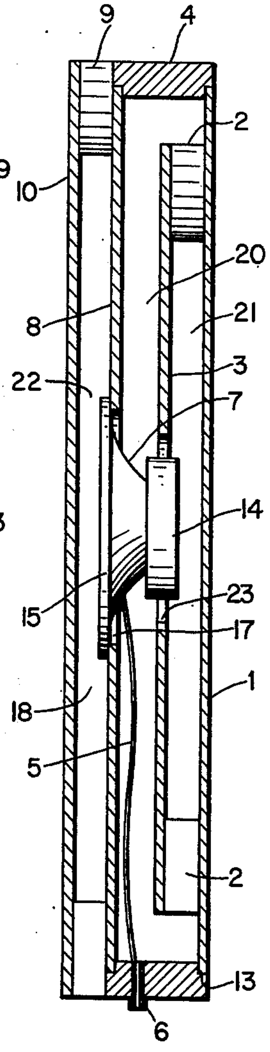
FIG. 4 is a side sectional view of the speaker along section I-I and divulging the structural relationship between the components.

Referring now to FIGS. 1–4 and to the details of the construction and operation of this invention, numerals 1-22 comprise the various components of the structure which comprises the present invention. The speaker component is represented by numeral 7 and the speaker component is mounted in speaker component mounting panel 8 which said panel is located within and surrounded by frame component 4. The frame component 4 contains front groove 12 and back groove 13 which are designed and adapted to respectively receive the front wall or mounting panel 8 and the back wall or panel 1. The baffle or partition 3 is mounted upon the back wall 1 between the back wall and the speaker component mounting panel by affixing the baffle or partition 3 upon a series of dowels located in a spaced relation on the inside surface of back wall 1 and represented in FIG. 1 by numeral 2 which refers only to an exemplary dowel of the plurality employed. Any convenient number of dowels may be used. The speaker component 7 is mounted in the speaker component mounting panel 8 through the opening 17 in said speaker mounting panel. It is preferable to mount the speaker component and rim 16 in a reverse fashion, that is, by inserting it through the opening 17 from the side of the speaker component mounting panel closest to the front wall or panel 10.

Preferably, either or both of the baffle or partition 3 and the speaker component mounting panel 8 will contain ribs 11 in plurality. In addition, the baffle or partition 3 contains an opening 23 which assists in permitting the passage of sound waves into the bass resonance chamber 21 which is formed between the baffle or partition 3 and the back wall 1.

It is important that the dimensions of the baffle or partition 3 be less in area than that of the back wall 1 in order to permit the flow of sound waves around the baffle or partition 3 and into the bass resonance chamber 21.

A tenor resonance chamber 20 is formed between the baffle or partition 3 and the speaker component mounting panel 8.

A sound diffusion receptacle area 22 is formed between front wall or panel 10 and the speaker component mounting 8 but the front wall or panel 10 is separated from the frame 4 by the width of front dowels 9 of which the drawing illustrates one which is representative of 4 located at the 4 inside corners of front wall 10. Thus, the effect upon the structure is to form a series of sound ports 18 and 19 connecting the sound diffusion receptacle area with the atmosphere. The speaker component 7 also includes speaker magnet 14 at its base and a lead connector 5 connects the speaker component 7 to a standard jack 6. Numeral 15 refers to the speaker cone which combines with the speaker magnet 14 to form the speaker component in broad terms.

When the speaker component mounting panel 8 with its speaker component 7 is mounted in a fixed fashion such as by glue in the frame component 4 and the back wall 1 and front wall or panel 10 are located in their respective grooves 12 and 13 and the baffle or partition 3 is located upon the inside of back wall 1, a complete sound chamber system is created. There is tenor resonance chamber 20, bass resonance chamber 21 and sound diffusion receptacle area 22 with its respective sound ports 18 and 19.

In operation, sound from any chosen sound source such as an amplifier, is reproduced through the speaker component which may be of any type speaker known. Sound waves emanate from the upper portion of the cone 15 and reflect and are deflected from the interior of front wall or panel 10 in a series of deflections or reflections and escape into the atmosphere through sound ports 18 and 19. In escaping, these sound waves are as well reflected and deflected from the surface of speaker component mounting panel 8. Sound waves emanating from the base of the cone 15 near the magnet 14 which is designed to extend through the opening 23 in the baffle or partition 3 and while deflected and reflected from the baffle or partition 3 and the surface of speaker component mounting panel 8 and proceed around the edges of the baffle or partition 3 into the bass resonance chamber 21. The sound waves arriving in resonance chamber 21 are then conducted through the back wall 1 and, in the instance where the speaker is mounted upon a wall, the sound waves are then partially reflected from the wall and partially absorbed into the wall. Thus, the combination of the result and effect is sound waves emanating from two sources. First from the sound ports 18 and 19 and secondly, where the speaker is mounted upon a wall, through the resonance chamber 21 and then through back wall 1 and partially deflected from and partially absorbed by the wall upon which the speaker may be mounted.

In addition, it is to be noted that it is preferable and most advantageous and important that the sound chamber system represented by tenor resonance chamber 20 and bass resonance chamber 21 be a sealed environment. To this end, the back wall 1 and speaker component mounting panel 8 are affixed respectively to the frame 4 in a sealed fashion. Likewise, the speaker component 7 is located in a sealed fashion within speaker component mounting panel 8. The sealed result can be achieved by the use of thermal glue or any other satisfactory and known sealing means. As well, the speaker component 7 may be riveted to its panel 8.

The speaker which comprises the invention herein including the speaker component and related structure is particularly designed for the purpose of hanging on a wall. The desired and optimum maximum overall dimensions are 18 inches by 20 inches by 3 inches. Even with this small size, the speaker which is the subject matter of this invention produces exceedingly high quality, tone and clarity in its reproduction of sound. Quality, tone and clarity even to the extent of producing an effect of complete realism, that is as if the sound were present directly adjacent to the listener. The most optimum result is achieved by mounting the speaker on a wall in accordance with the operations described hereinbefore. This can be achieved easily in a concealed fashion behind a picture or similar element upon a wall due to the size discussed earlier. While the present speaker is most advantageously designed for quadraphonic use, it produces an exceedingly higher than average sound quality in mono or stereo systems and is of unequaled quality when utilized in a quadraphonic system. When used in a quadraphonic system, the sound separation and trueness of notes is such that it is unnecessary to position yourself in the normal manner in order to enjoy optimum listening pleasure as this speaker, especially in conjunction with other similar speakers is heard equally from any position in a given area. This is due to the formation of a complete sound matrix arising from the operation of the speaker as discussed above and based upon the particular structural features set forth herein.

The ribs 11 also serve an important function. The intensity of sound waves often results in extreme vibrationed effects being produced. This drawback and problem is overcome by the use of the ribs 11 which stabilize the elements to which they are attached and avoid any interference that would derive from the vibrating of baffle or partition 3 and or speaker component mounting panel 8. In addition, however, the ribs 11 also direct, channel and compress the air movement inside the resonance chambers in such a manner as to provide large room coverage even with low sound volume. This result is achieved due to the fact that ribs 11 in combination with the resonance chambers results in the projection of the sound waves having greater extension in both time and space.

Another unique feature of this system is that the speaker is compatible with any amplifier, whether of high or low output voltage, without damage to the speaker, even when an inexpensive speaker component is employed.

The frame 4 may be made or comprised of wood or some equivalent substance. As well, the back wall 1, dowels 2 and 9, baffle or partition 3 and the front wall 10 may be formed of masonite or equivalent substances. The ribs 11 may be formed of wood or some equivalent substance and may be varied as to their spacing upon the baffle or partition 3 and or the speaker component mounting panel 8. The speaker component 7 may be any suitable known component such as a 10 ounce magnet, 8 ohm, 5 inch cone component. The jack 6 is any standard jack such as an RCA phono jack.

It should be noted that one of the outstanding features of the present invention derives from the fact that sound travels faster in a substance such as wood. This is important when a speaker is mounted upon a wall and the base notes emanate through the base resonance chamber and the back wall 1 and are partially reflected or deflected from the wall upon which the speaker is mounted. The result as mentioned above is two independent waves; one emanating through the resonance chamber 21 and from the wall upon which speaker is mounted and the other derived from the sound ports 18 and 19. Thus, no comingling or interference occurs between the waves such as occurs in normal speakers where the sound waves emanate at an angle from the cone. Especially avoided is the problem where such sound waves emanating from a plurality of tones in separate speakers interfere and comingle and force the precise location of the speakers and the listener to avoid this problem.

In addition, the structure and operation of the present speaker not only is most advantageously employed with relation to a plurality of separate speakers but also can be successfully employed when multiple speakers are contained in the same cabinet or container.

From the foregoing, it can be seen that what can be provided is a useful device in the form of a speaker comprised of the elements identified and described hereinbefore and resulting in a greatly improved, high quality sound reproduction with excellent tone, clarity and reception.

The present invention may be embodied in other specific forms without departing from the spirit or essential characteristics thereof. The presently disclosed embodiments are therefore to be considered in all respects as illustrative and not restrictive, the scope of the invention being indicated by the appended claims rather than by the foregoing description and all changes which come within the meaning and range of equivalency of the claims are therefore intended to be embraced therein.

What is claimed is:

1. An audio frequency speaker assembly for housing a conventional speaker of the type having a larger forward end and a smaller diameter rear end constituted of the magnet structure, such speaker assembly being of generally thin form for adaptation to wall surface mounting, the speaker assembly comprising:

frame means for geometrically regular character having parallel front and back sides and defining an interior space having a predetermined transverse area;

mounting panel means secured to the front side of said frame means which is of rigid construction and extending over said predetermined transverse area, said mounting panel means having a centrally located aperture which is adapted to receive the forward end of the speaker therein in secure affixure with the rear end extending within the frame means interior space, said mounting panel means further including a plurality of first elongate rib members secured to one side thereof and extending into the frame means interior space;

back panel means of rigid structure secured to the back side of said frame means and being of said predetermined transverse area;

baffle panel means of rigid structure which is similar in transverse shape but lesser than said predetermined transverse area, said baffle means having a centrally located aperture for receiving the speaker magnet end therethrough in non-interfering relationship and having a plurality of second elongate rib members disposed thereon in parallel to said first rib members as said baffle panel means is rigidly supported between said back panel means and said mounting panel means within the interior space of said frame means with said first and second rib members facing toward each other in parallel, non-interfering relationship; and front panel means of rigid structure and having said predetermined transverse area, which means is secured in spaced relationship to the front of said frame means and mounting panel means.

2. A speaker assembly as set forth in claim 1 which is further characterized in that:

said first and second rib members are of even number and equi-spaced relative to said transverse area.

3. A speaker assembly as set forth in claim 2 wherein there are two of said second elongate rib members and four of said first elongate rib members.

4. A speaker assembly as set forth in claim 1 which is further characterized in that:

said front panel means presents a smooth forward surface for adaptation to receive decorative subject matter.

5. A speaker assembly as set forth in claim 1 which is further characterized to include:

a plurality of support means rigidly securing said baffle panel means to said back panel means.

6. A speaker assembly as set forth in claim 1 wherein:

said baffle means centrally located aperture is of appreciably greater diameter than said speaker magnet end thereby to define an annular air passage through said baffle panel means.

* * * * *